United States Patent
Brofman et al.

(10) Patent No.: US 6,258,625 B1
(45) Date of Patent: Jul. 10, 2001

(54) METHOD OF INTERCONNECTING ELECTRONIC COMPONENTS USING A PLURALITY OF CONDUCTIVE STUDS

(75) Inventors: Peter J. Brofman, Hopewell Junction; Sudipta K. Ray, Wappingers Falls; Kathleen A. Stalter, Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/315,374

(22) Filed: May 18, 1999

(51) Int. Cl.[7] ............................. H01L 21/44; H01L 23/52

(52) U.S. Cl. ..................... 438/107; 438/108; 438/118; 257/777

(58) Field of Search ................................. 438/106, 118, 438/119, 110, 127, 612, 613, 615, 622, 623, 626, 629, 107; 257/698, 786, 691, 692, 725, 776, 779, 783, 784, 777; 29/832, 840; 156/310

(56) References Cited

U.S. PATENT DOCUMENTS

| | | |
|---|---|---|
| 4,862,588 | 9/1989 | MacKay . |
| 5,006,673 * | 4/1991 | Freyman et al. ..................... 174/255 |
| 5,084,071 | 1/1992 | Nenadic et al. . |
| 5,163,834 | 11/1992 | Chapin et al. . |
| 5,420,520 | 5/1995 | Anschel et al. . |
| 5,523,696 | 6/1996 | Charlton et al. . |
| 5,545,281 * | 8/1996 | Matsui et al. ..................... 156/273.7 |
| 5,565,707 | 10/1996 | Colgan et al. . |
| 5,611,140 * | 3/1997 | Kulesza et al. ........................ 29/832 |

\* cited by examiner

*Primary Examiner*—Charles Bowers
*Assistant Examiner*—Brook Kehede
(74) *Attorney, Agent, or Firm*—DeLio & Peterson, LLC; Peter W. Peterson; Ira D. Blecker

(57) ABSTRACT

A method of interconnecting electronic components by using a plurality of conductive studs on a surface of a first electronic component and a plurality of corresponding conductive vias on the surface of a second electronic component. Camber on the surface of electronic components may be overcome by coating the surface with a dielectric, planarizing the dielectric, and forming conductive vias corresponding to the contact pads thereon. The conductive studs are substantially lead-free and preferably comprise of copper.

14 Claims, 2 Drawing Sheets

METHOD OF INTERCONNECTING ELECTRONIC COMPONENTS USING A PLURALITY OF CONDUCTIVE STUDS

CROSS-REFERENCE TO RELATED APPLICATIONS

Aspects of the present invention are related to subject matter disclosed in co-pending applications entitled "Z-Axis Compressible Polymer With Fine Metal Matrix Suspension," Ser. No. 09/315,373 filed on even date herewith and assigned to the assignee of the present invention, the subject matter of which is hereby incorporated by reference.

BACKGROUND OF THE INVENTION

1. Field of the Invention

This invention relates to electronic components which utilize a substantially lead-free interconnect process when forming an electronic module.

2. Description of Related Art

As the circuit density increases on integrated circuit devices such as silicon microprocessors, there is a need for high density interconnection between such a device and a chip carrier to which these devices are typically attached. Traditional methods of joining using solder ball arrays may become difficult with such dense circuitry.

Typically, solder ball arrays require fluxes when joining lead based solders. With connection densities reaching about 150 $\mu$m or below, it becomes difficult to clean such fluxes. Without effective flux cleaning, underfill materials which are used to enhance reliability of the resulting electronic module run the risk of delaminating. The use of lead based solder also increases the difficulties in disposing of any waste.

The circuit density also poses problems with shorting between adjacent solder balls particularly on chip carriers having camber or deformities. Typical chip carriers such as a ceramic substrate exhibit about 25 to about 50 $\mu$m camber as measured from a flat surface of the substrate. When a device with solder balls is joined to such a carrier, some of the solder balls contact the mating pads. Due to the wetting action of the solder the device is pulled down and remaining solder balls which make contact further pull down the chip. As a result, after joining, many of the solder balls are in closer proximity to each other and may be contacting each other leading to shorts.

Bearing in mind the problems and deficiencies of the prior art, it is therefore an object of the present invention to provide a method of interconnecting high circuit density electronic components utilizing substantially lead-free interconnects which do not require flux and takes into account the deformities on a substrate surface.

It is another object of the present invention to provide an electronic module having high circuit density electronic components which utilizes substantially lead-free interconnects which do not require flux and takes into account the deformities on a substrate surface.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of interconnecting electronic components comprising the steps of: (a) providing a first electronic component having electrical devices with corresponding bonding pads, the first electronic component having a patterned dielectric film formed thereon, the dielectric film having a plurality of protruding conductive studs, the studs corresponding to the bonding pads and adapted for electrical connection to the electrical devices; (b) providing a second electronic component having a dielectric film formed thereon, the dielectric film adapted to offset camber on a surface of the second electronic component having a plurality of conductive vias corresponding to the studs on the first electronic component; (c) providing an interposer having electrical interconnections corresponding to the studs and vias; and (d) aligning and contacting the first electronic component and the second electronic component with the interposer disposed therebetween, such that the studs of the first electronic component and the vias of the second electronic component are adapted to be electrically and mechanically interconnected by the interposer.

Preferably, step (a) comprises providing a semiconductor chip having electrical devices with corresponding bonding pads, the chip having a patterned and cured polyimide film formed thereon, the polyimide film having a plurality of protruding conductive metal studs, the studs corresponding to the bonding pads and adapted for electrical connection to the electrical devices.

Preferably, in step (a) the studs protruding about 15 $\mu$m to about 20 $\mu$m from a surface of the dielectric film and having of about 50 to about 75 $\mu$m and may comprise copper.

Preferably, step (b) comprises providing a substrate having a cured polyimide film formed thereon, the polyimide film having a plurality of copper vias substantially planar to a surface of the film and capped with gold, the vias corresponding to the studs on the first electronic component. Preferably, in step (b) the vias have a height of at least about 15 to about 30 $\mu$m and may protrude about 10 to about 15 $\mu$m from a surface of the dielectric film.

Preferably, step (b) comprises providing a substrate having a dielectric film formed thereon, the dielectric film adapted to offset camber on a surface of the substrate having a plurality of protruding conductive metal vias corresponding to the studs on the first electronic component.

Preferably, step (c) comprises providing a flexible interposer having electrical interconnections comprising conductive metal vias with palladium dendrites formed on a top exposed surface and a bottom exposed surface.

The present invention is directed to, in another aspect, an electronic module comprising a first electronic component having electrical devices with corresponding bonding pads, the first electronic component having a first dielectric film formed thereon, the film having a plurality of conductive studs corresponding to the bonding pads and adapted for electrical connection to the electrical devices; a second electronic component having a second dielectric film formed thereon, the film having a plurality of conductive vias corresponding to the studs on the first electronic component; an interposer disposed between the first and second electronic components having a plurality of interconnections corresponding to the studs of the first electronic component and the vias of the second electronic components. Preferably, the plurality of conductive studs protrude about 15 to about 20 $\mu$m from a surface of the first dielectric film with a diameter of about 50 to about 75 $\mu$m.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
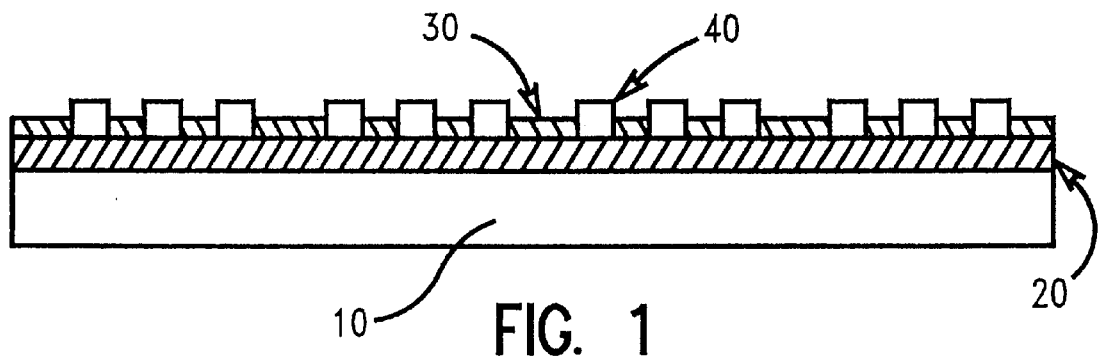
FIG. 1 is a cross-sectional view of a silicon wafer having the substantially lead-free protruding conductive studs of the present invention.

In describing the preferred embodiment of the present invention, reference will be made herein to FIGS. 1–5 of the drawings in which like numerals refer to like features of the invention. Features of the invention are not necessarily shown to scale in the drawings.

The present invention discloses a novel interconnect methodology using a substantially lead-free stud that provides an essentially planar surface for chip to substrate interconnection. The present invention reduces the difficulties encountered when joining a chip to a substrate having deformities on the substrate surface which cause the traditional solder interconnects to flow away from a solder pad that it is not in contact with. Additionally, the use of an interconnect technology which does not utilize lead based solder is of significant environmental benefit.

In preparing a chip and substrate for interconnection in accordance with the present invention, an array of protruding lead-free metal studs are formed on the silicon device as shown in FIG. 1. A silicon wafer 10 is provided with, preferably, a number of electrical devices formed thereon encompassed in wiring layer 20. After the last wiring level is finished on wafer 10, a blanket layer of a dielectric material 30 is preferably applied to the surface of wafer 10.

Dielectric material 30 is preferably a photosensitive material, most preferably polyimide, and is adapted to have a thickness of approximately 40 to 50 μm after full curing. Depending upon the dielectric chosen, the curing conditions would be known to one of ordinary skill in the art. Dielectric 30 is patterned with a standard photo expose, develop and cure process. The pattern exposed on the dielectric would correspond to bonding pads electrically connected to the electrical devices formed on wafer 10.

A blanket layer of a conductive material, preferably a metal, is deposited over wafer 10 to fill the pattern of holes in dielectric 30. Where the conductive material is a metal, to enhance adhesion of the metal, a first metal may be preferably sputter deposited into the pattern holes of dielectric 30, followed by the sputter deposition of a second metal which has better conductivity. Preferably, the metal is chromium/copper such that chromium may be sputter deposited first to provide better adhesion of the copper. Upon substantially filling the pattern holes of dielectric 30, planarization techniques are used to planarize the studs 40 with the dielectric 30. Typical planarization techniques may be chemical mechanical polishing.

Figure 2:
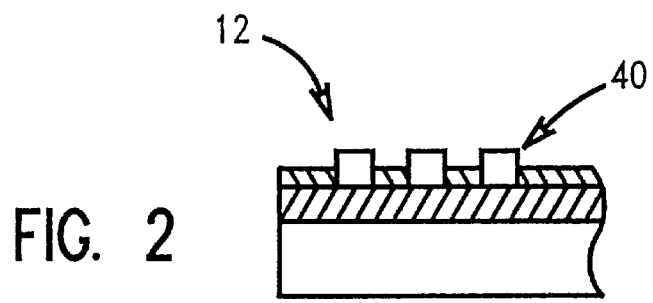
FIG. 2 is a cross-sectional view of a singulated chip or die made in accordance with a method of the present invention.

At this stage, it is preferred to plasma etch the dielectric 30 such that studs 40 protrude about 15 μm to about 20 μm from a surface of the dielectric 30. The plasma etching may be carried out in an oxygen atmosphere under conditions which allow for controllable etching of the dielectric 30. Most preferably, the studs 40 have a diameter of about 50 μm to about 70 μm. Studs 40, now exposed and protruding from a surface of dielectric 30, may be coated with about 500 to about 1000Å of gold, preferably by electroless plating. The wafer is then subjected to a diffusion step preferably in an inert atmosphere at about 200 to about 300° C. Wafer 10 is then singulated to produce the individual chip or die 12 as shown in FIG. 2 for connection to a chip carrier.

Figure 3:
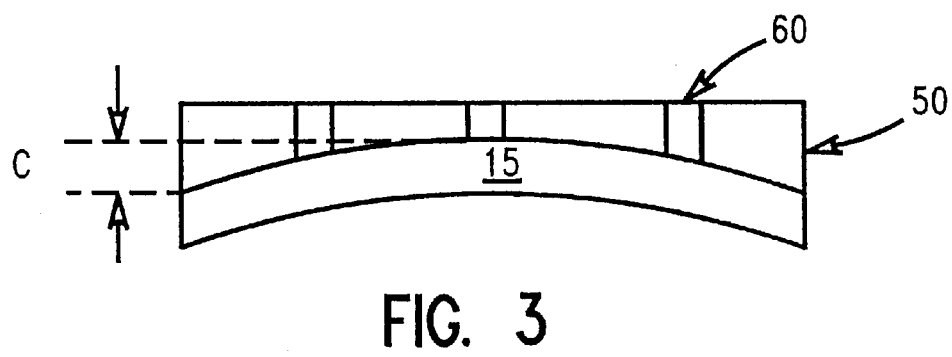
FIG. 3 is a cross-sectional view of a deformed chip carrier planarized in accordance with a method of the present invention.

FIG. 3 shows a typical chip carrier 15 having a slight deformity as shown by camber C. Typical chip carriers such as a ceramic substrate typically exhibit about 25 μm to about 50 μm of camber. Chip carrier 15 is planarized by utilizing a process where a dielectric layer 50 is applied and cured on chip carrier 15 such that a thickness of camber and dielectric 50 of about 60 to about 90 μm, preferably about 75 μm, is achieved. Preferably, dielectric 50 comprises polyimide.

Dielectric 50 is planarized using chemical mechanical polishing or other techniques to produce a flat surface with a maximum thickness on the camber of about 40 μm. An array of vias 60 are created preferably by laser ablation which correspond to the studs 40 for interconnection to the corresponding electrical devices on wafer 10. Preferably, the vias 60 are substantially filled with a conductive material such as a metal. Where vias 60 comprise metal, to enhance adhesion a blanket layer of a first metal is sputter deposited followed by sputter deposition of a second more conductive metal.

Figure 3A:
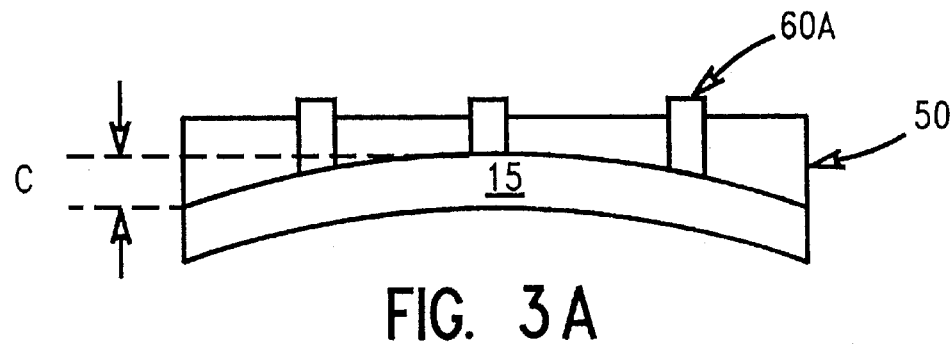

Dielectric 50 is again planarized to create a level array of vias 60. If desired, the exposed conductive surfaces may be capped with gold plating and followed by diffusion. In another embodiment shown in FIG. 3A, vias 60A may protrude about 10 μm to about 15 μm from the surface of dielectric 50 by etching back a portion of dielectric 50. Preferably, vias 60 comprise chromium/copper having a minimum height on chip carrier 15 of between about 15 μm to about 30 μm where the chip carrier has little deformity and a maximum via height of about 30 μm to about 60 μm where chip carrier 15 has a high degree of deformity, or camber.

Figure 4:
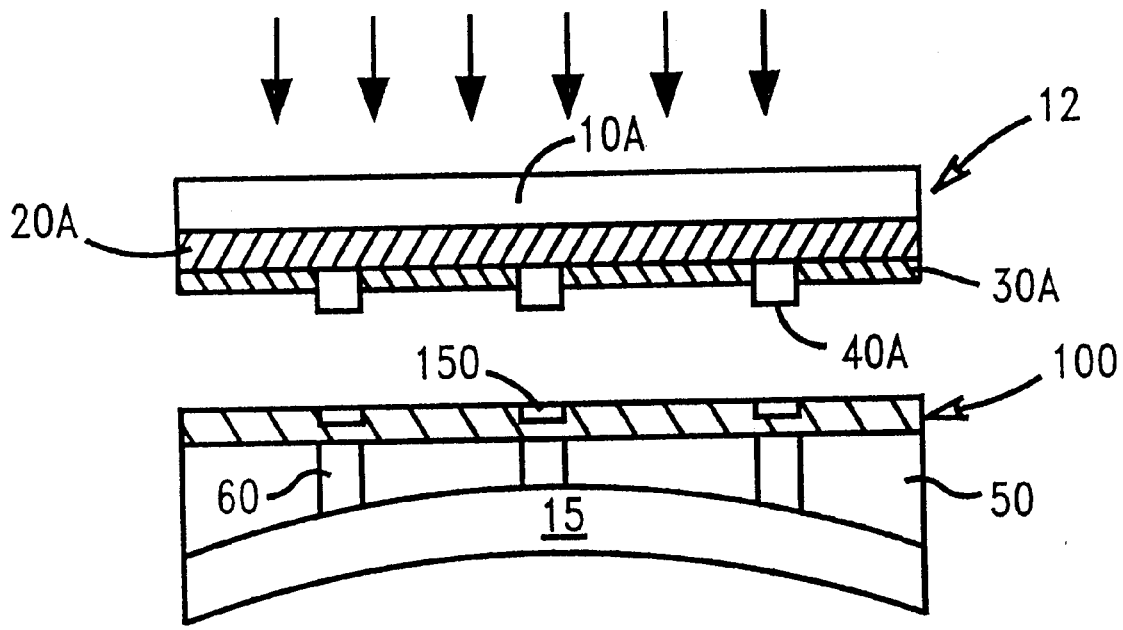
FIG. 4 is a cross-sectional view of a chip, a chip carrier and an interposer when practicing a method of the present invention.
Figure 5:
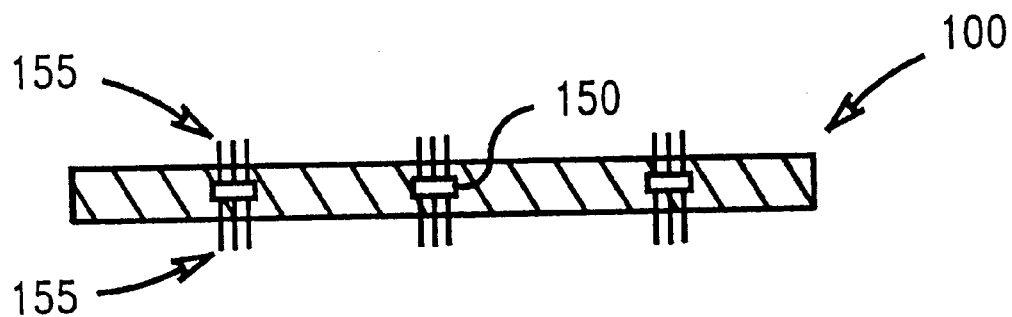
FIG. 5 is a cross-sectional view of an interposer utilized in the present invention.

FIG. 4 illustrates a method of interconnecting a chip to a substrate in accordance with a method of the present invention. Chip 12 is shown as being aligned over chip carrier 15 such that protruding studs 40A correspond to vias 60. An interposer 100 is aligned and disposed between chip 12 and chip carrier 15. To connect the array of studs 40A with vias 60, heat and pressure are usually applied after interposer 100, chip 12 and chip carrier 15 are contacted together. A preferred interposer is disclosed in the aforementioned co-pending application entitled "Z-Axis Compressible Polymer With Fine Metal Matrix Suspension," Ser. No. 09/315,373 filed on even date herewith and assigned to the assignee of the present invention, although other interposers may also be contemplated.

Preferably, interposer 100 comprises polyimide or some other suitable flexible material and has through-studs 150 which correspond to studs 40A and vias 60 for interconnecting chip carrier 15 to chip 12. Most preferably, through-studs 150 on interposer 100 have palladium dendrites 155 plated or both exposed surfaces. The dendrites 155 make contact with the matching array of studs 40A and vias 60. The protrusion of studs 40A assures that contact is first made between the matching array of studs 40A when pressure is applied to interposer 100. This allows for small variations in the interposer thickness and tolerances in the planarity achieved in the leveled camber of chip carrier 15. Interposer 100, not being permanently bonded to chip 12 or chip carrier 15, may be used during test and burn-in of the chip 12 since they are easily separable.

Once chip 12 and chip carrier 15 have passed inspection and require permanent bonding, interposer 100 may be replaced with an interposer made from a thin epoxy material about 20 $\mu$m to about 40 $\mu$m thick with the suitable array of through-studs filled with a conductive material such as gold or silver. The epoxy interposer is then aligned to both chip 12 and chip carrier 15 and permanently bonded by applying heat and pressure. Vias 60 on chip carrier 15 and the protruding studs 40A on chip 12 assure that good electrical contacts are made. Of course, other methods of permanently bonding chip 12 and chip carrier 15 may also be contemplated.

The present invention achieves the objects recited above. The present invention discloses a novel interconnect methodology using a substantially lead-free stud that provides an essentially planar surface for chip to substrate interconnection. The use of the protruding studs provides a substantially planar surface for interconnection with a chip carrier or substrate. Additionally, camber on the surface of the substrate may be overcome by coating the substrate with a dielectric film and planarizing the dielectric film to provide a substantially planar surface for interconnection.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of interconnecting electronic components comprising the steps of:
    (a) providing a first electronic component having electrical devices with corresponding bonding pads, said first electronic component having a patterned dielectric film formed thereon, said dielectric film having a plurality of protruding conductive studs, said studs corresponding to the bonding pads and adapted for electrical connection to the electrical devices;
    (b) providing a second electronic component having a dielectric film formed thereon, said dielectric film having a plurality of conductive vias corresponding to the studs on said first electronic component;
    (c) providing an interposer having electrical interconnections corresponding to the studs and vias; and
    (d) aligning said first electronic component and said second electronic component with said interposer disposed therebetween, such that the studs of said first electronic component and the vias of said second electronic component are adapted to be electrically interconnected by said interposer.

2. The method of claim 1 wherein in step (b) said second electronic component is formed by
    (a) forming a layer of dielectric on a surface of said second electronic component;
    (b) planarizing said layer of dielectric;
    (c) forming a plurality of vias corresponding to contact pads on said second electronic component;
    (d) filling said vias with a conductive material; and
    (e) planarizing said vias.

3. The method of claim 1 wherein step (c) comprises providing a flexible interposer having electrical interconnections comprising conductive metal vias with palladium dendrites formed on a top exposed surface and a bottom exposed surface.

4. The method of claim 1 further including the step of heating said first electronic component and said second electronic component with said interposer disposed therebetween such that said interposer provides mechanical interconnection for said electronic components.

5. A method of interconnecting electronic components comprising the steps of:
    (a) providing a semiconductor chip having electrical devices with corresponding bonding pads, said semiconductor chip having a patterned dielectric film formed thereon, said dielectric film having a plurality of protruding conductive studs, said studs corresponding to the bonding pads and adapted for electrical connection to the electrical devices;
    (b) providing a substrate having a cambered surface with a planarized dielectric film formed thereon having a plurality of planar conductive vias of varying depths corresponding to the studs on said semiconductor chip;
    (c) providing an interposer having electrical interconnections corresponding to the studs and vias; and
    (d) aligning said semiconductor chip and said substrate with said interposer disposed therebetween, such that the studs of said semiconductor chip and the vias of said substrate are adapted to be electrically interconnected by said interposer.

6. The method of claim 5 wherein in step (b) said substrate is provided by
    (a) forming a layer of dielectric on the cambered surface of said substrate;
    (b) planarizing said layer of dielectric;
    (c) forming a plurality of vias corresponding to contact pads on said substrate;
    (d) filling said vias with a conductive material; and
    (e) planarizing said vias.

7. A method of interconnecting electronic components comprising the steps of:
    (a) providing a semiconductor chip having electrical devices with corresponding bonding pads, said chip having a patterned and cured polyimide film formed thereon, said polyimide film having a plurality of protruding conductive metal studs, said studs corresponding to the bonding pads and adapted for electrical connection to the electrical devices with corresponding bonding pads, said semiconductor chip having a patterned dielectric film formed thereon, said dielectric film having a plurality of protruding conductive studs, said studs corresponding to the bonding pads and adapted for electrical connection to the electrical devices;
    (b) providing a second electronic component having a dielectric film formed thereon, said dielectric film having a plurality of conductive vias corresponding to the studs on said semiconductor chip;
    (c) providing an interposer having electrical interconnections corresponding to the studs and vias; and
    (d) aligning said semiconductor chip and said second electronic component with said interposer disposed therebetween, such that the studs of said first electronic component and the vias of said second electronic component are adapted to be electrically interconnected by said interposer.

8. A method of interconnecting electronic components comprising the steps of:

(a) providing a first electronic component having electrical devices with corresponding bonding pads, said first electronic component having a patterned dielectric film formed thereon, said dielectric film having a plurality of protruding conductive studs, said studs protruding about 15 µm to 20 µm from a surface of said dielectric film and having a diameter of about 50 µm to about 75 µm, said studs corresponding to the bonding pads and adapted for electrical connection to the electrical devices;

(b) providing a second electronic component having a dielectric film formed thereon, said dielectric film having a plurality of conductive vias corresponding to the studs on said first electronic component;

(c) providing an interposer having electrical interconnections corresponding to the studs and vias; and (d) aligning said first electronic component and said second electronic component with said interposer disposed therebetween, such that the studs of said first electronic component and the vias of said second electronic component are adapted to be electrically interconnected by said interposer.

9. A method of interconnecting electronic components comprising the steps of:

(a) providing a first electronic component having electrical devices with corresponding bonding pads, said first electronic component having a patterned dielectric film formed thereon, said dielectric film having a plurality of protruding conductive studs which comprise copper, said studs corresponding to the bonding pads and adapted for electrical connection to the electrical devices;

(b) providing a second electronic component having a dielectric film formed thereon, said dielectric film having a plurality of conductive vias corresponding to the studs on said first electronic component;

(c) providing an interposer having electrical interconnections corresponding to the studs and vias; and (d) aligning said first electronic component and said second electronic component with said interposer disposed therebetween, such that the studs of said first electronic component and the vias of said second electronic component are adapted to be electrically interconnected by said interposer.

10. A method of interconnecting electronic components comprising the steps of:

(a) providing a first electronic component having electrical devices with corresponding bonding pads, said first electronic component having a patterned dielectric film formed thereon, said dielectric film having a plurality of protruding conductive studs, said studs corresponding to the bonding pads and adapted for electrical connection to the electrical devices;

(b) providing a second electronic component having a substrate having a cured polyimide film formed thereon, said polyimide film having a plurality of copper vias substantially planar to a surface of said film and capped with gold, said vias corresponding to the studs on said first electronic component;

(c) providing an interposer having electrical interconnections corresponding to the studs and vias; and (d) aligning said first electronic component and said second electronic component with said interposer disposed therebetween, such that the studs of said first electronic component and the vias of said second electronic component are adapted to be electrically interconnected by said interposer.

11. A method of interconnecting electronic components comprising the steps of:

(a) providing a first electronic component having electrical devices with corresponding bonding pads, said first electronic component having a patterned dielectric film formed thereon, said dielectric film having a plurality of protruding conductive studs, said studs corresponding to the bonding pads and adapted for electrical connection to the electrical devices;

(b) providing a second electronic component having a dielectric film formed thereon, said dielectric film having a plurality of conductive vias corresponding to the studs on said first electronic component, and said vias have a depth of at least 15 to about 30 µm;

(c) providing an interposer having electrical interconnections corresponding to the studs and vias; and (d) aligning said first electronic component and said second electronic component with said interposer disposed therebetween, such that the studs of said first electronic component and the vias of said second electronic component are adapted to be electrically interconnected by said interposer.

12. The method of claim 10 wherein in step (b) said plurality of copper vias protrude about 10 to about 15 µm from a surface of said planarized dielectric film.

13. A method of interconnecting electronic components comprising the steps of:

(a) providing a first electronic component having electrical devices with corresponding bonding pads, said first electronic component having a patterned dielectric film formed thereon, said dielectric film having a plurality of protruding conductive studs, said studs corresponding to the bonding pads and adapted for electrical connection to the electrical devices;

(b) providing a second electronic component having a substrate having a cambered surface with a planarized dielectric film formed thereon, said dielectric film having a plurality of planar conductive vias of varying depth corresponding to the studs on said first electronic component;

(c) providing an interposer having electrical interconnections corresponding to the studs and vias; and (d) aligning said first electronic component and said second electronic component with said interposer disposed therebetween, such that the studs of said first electronic component and the vias of said second electronic component are adapted to be electrically interconnected by said interposer.

14. A method of interconnecting electronic components comprising the steps of:

(a) providing a semiconductor chip having electrical devices with corresponding bonding pads, said semiconductor chip having a patterned dielectric film formed thereon, said dielectric film having a plurality of protruding conductive studs which comprise copper, said studs corresponding to the bonding pads and adapted for electrical connection to the electrical devices;

(b) providing a substrate having a cambered surface with a planarized dielectric film formed thereon having a plurality of planar conductive vias of varying depths corresponding to the studs on said semiconductor chip;

(c) providing an interposer having electrical interconnections corresponding to the studs and vias; and (d) aligning said semiconductor chip and said substrate with said interposer disposed therebetween, such that the studs of said semiconductor chip and the vias of said substrate are adapted to be electrically interconnected by said interposer.

* * * * *